(12) United States Patent
Lee

(10) Patent No.: US 6,320,415 B1
(45) Date of Patent: Nov. 20, 2001

(54) CMOS INPUT/OUTPUT CONTROL CIRCUIT CAPABLE OF TOLERATING DIFFERENT VOLTAGE INPUT

(75) Inventor: Kun-Han Lee, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/541,277

(22) Filed: Apr. 3, 2000

(51) Int. Cl.[7] ............................................... H03K 19/0175
(52) U.S. Cl. .................... 326/81; 326/83; 326/57
(58) Field of Search .................... 326/80, 81, 83, 326/86, 56–58

(56) References Cited

U.S. PATENT DOCUMENTS

| | | | |
|---|---|---|---|
| 5,451,889 | * 9/1995 | Heim et al. | 326/81 |
| 5,534,795 | * 7/1996 | Wert et al. | 326/81 |
| 5,880,602 | * 3/1999 | Kaminaga et al. | 326/81 |
| 5,973,511 | * 10/1999 | Hsia et al. | 326/81 |

* cited by examiner

Primary Examiner—Michael Tokar
Assistant Examiner—Don Phu Le
(74) Attorney, Agent, or Firm—Thomas, Kayden, Horstemeyer & Risley (57) ABSTRACT

A CMOS input/output control circuit capable of operating normally under different input voltages such as 2.5 V, 3.3 V and 5 V. Moreover, the PMOS transistor inside the n-well region is shut by a gate control circuit and an n-well control circuit of this invention when a 5 V input voltage is applied to the circuit.

8 Claims, 9 Drawing Sheets

CMOS INPUT/OUTPUT CONTROL CIRCUIT CAPABLE OF TOLERATING DIFFERENT VOLTAGE INPUT

BACKGROUND OF THE INVENTION

1. Field of Invention

The present invention relates to a CMOS input/output control circuit. More particularly, the present invention relates to a CMOS input/output control circuit capable of tolerating a range of voltage inputs.

2. Description of Related Art

Figure 1:
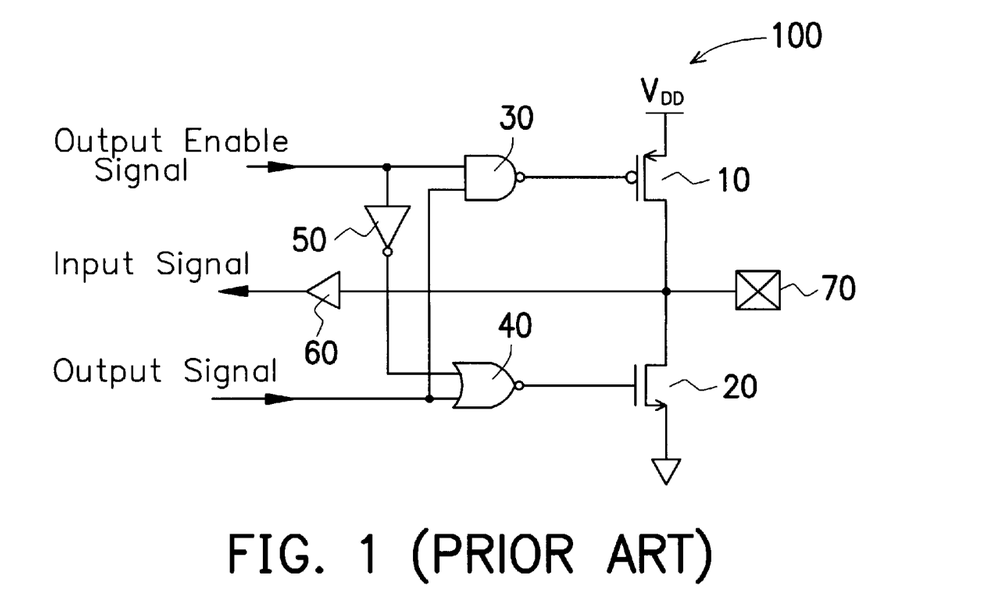
FIG. 1 is a schematic diagram of a conventional CMOS input/output control circuit.

FIG. 1 is a schematic diagram of a conventional CMOS input/output control circuit. As shown in FIG. 1, the CMOS input/output control circuit 100 comprises a PMOS transistor 10, an NMOS transistor 20, a NAND gate 30, a NOR gate 40, an inverter 50, a buffer 60 and an input/output pad 70.

(1) When the CMOS input/output control circuit 100 functions as an output device, a high potential level is applied to the output enable signal lead. A low potential level appears at the output terminal of the NAND gate 30 and a low potential level appears at the output terminal of the NOR gate 40. Hence, the PMOS transistor 10 is switched on while the NMOS transistor 20 is switched off. Consequently, the input/output pad 70 is at a high potential level (source voltage $V_{DD}$). Conversely, if a low potential level is applied to the output enable signal lead, a high potential level appears at the output terminal of the NAND gate 30 and the output terminal of the NOR gate 40. Hence, the PMOS transistor 10 is switched off while the NMOS transistor 20 is switched on. Consequently, the input/output pad 70 has a low potential.

(2) When the CMOS input/output control circuit 100 functions as an input device, a low potential level is applied to the output enable signal lead. Hence, the output terminal of the NAND gate 30 is at a high potential level and the low output enable signal after passing through the inverter 50 to the NOR gate 40 produces a low output potential level. Therefore, both the PMOS transistor 10 and the NMOS transistor are turned off. Consequently, signal to the input/output pad 70, whether the potential level is high or low, can be relayed to the buffer 60 and become an input signal for any internal circuit.

Under both circumstances, the CMOS input/output control circuit 100 is functional as long as the high potential is at the same level as the source voltage $V_{DD}$. However, since the development of submicron (smaller than 0.15 µm) VLSI fabrication technologies, required source voltage has dropped from 5 V to 3.3 V or 2.5 V.

Figure 2:
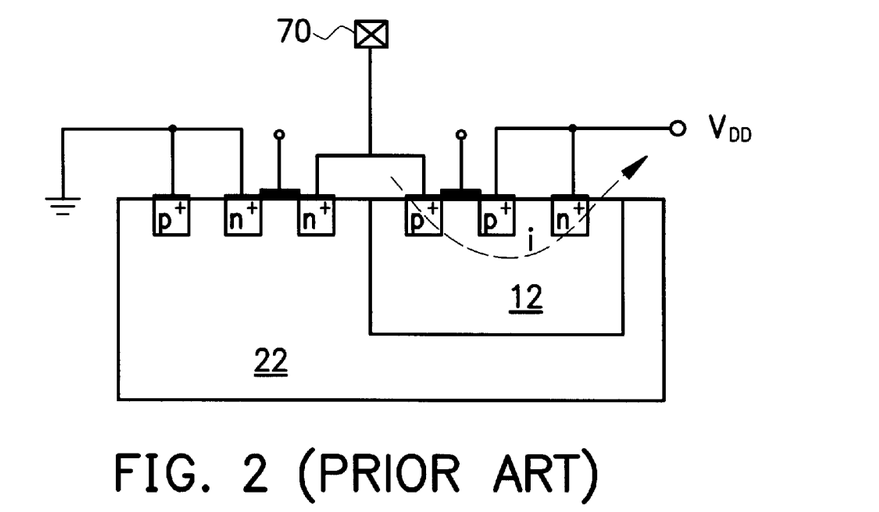
FIG. 2 is a schematic cross-sectional view of a conventional CMOS transistor.

FIG. 2 is a schematic cross-sectional view of a conventional CMOS transistor. According to fundamental CMOS processing concept, the n-well 12 must be coupled to the highest voltage level in the circuit. In other words, the n-well of the PMOS transistors must be coupled to the highest voltage. The p-substrate 22 of the NMOS transistor must be coupled to the lowest voltage or ground. The CMOS circuit operates normally within the input/output control circuit only when the aforementioned voltage connections are made.

However, if 5 V are applied to the input/output pad 70 when the source voltage $V_{DD}$ is at 3.3 V or 2.5 V, a PN junction current forward bias will flow in the n-well region shown in FIG. 2. This is because a higher voltage is applied to the input/output pad 70 the source voltage $V_{DD}$. Hence, a leakage current i will flow from the drain terminal to the n-well and then return back to the voltage source $V_{DD}$. Since the PMOS transistor may malfunction, a conventional input/output control circuit may fail when voltage applied to the input/output pad is higher than the source voltage $V_{DD}$.

SUMMARY OF THE INVENTION

Accordingly, one object of the present invention is to provide a CMOS input/output control circuit capable of operating normally under a range of input operating voltages such as 2.5 V, 3.3 V or 5 V.

A second object of this invention is to provide a CMOS input/output control circuit capable of tolerating a range of input voltages. To permit a 5 V input voltage, a gate control circuit and an n-well control circuit are used to turn off the PMOS transistor inside the n-well region of the CMOS input/output control circuit.

To achieve these and other advantages and in accordance with the purpose of the invention, as embodied and broadly described herein, the invention provides a CMOS input/output control circuit capable of tolerating a range of input voltages. The control circuit includes a PMOS transistor, an NMOS transistor, a NAND gate, a NOR gate, an inverter, a buffer, an input/output pad, an n-well control circuit and a gate control circuit. The n-well control circuit is coupled to the n-well of the PMOS transistor and the input/output pad. When an input voltage higher than the source voltage is applied, voltage at the n-well of the PMOS transistor is increased by the n-well control circuit to the source voltage level. The gate control circuit is coupled to the gate terminal of the PMOS transistor and the input/output pad. When an input voltage higher than the source voltage is applied, voltage at the gate terminal of the PMOS gate is increased by the gate control circuit to the source voltage level.

In a second embodiment of this invention, a CMOS input/output control circuit capable of tolerating a range of input voltage is provided. The circuit includes a NAND gate, an inverter, a NOR gate, a PMOS transistor, an NMOS transistor, an input/output pad, a first PMOS transistor, a second PMOS transistor, a third PMOS transistor, a fourth PMOS transistor, a fifth PMOS transistor, a sixth PMOS transistor, a first NMOS transistor, a second NMOS transistor, a third NMOS transistor and a fourth NMOS transistor. One of the input terminals of the NAND gate is an output enable signal terminal. The other input terminal of the NAND gate is an output signal terminal. The input terminal of the inverter is coupled to the output enable signal terminal. One of the input terminals of the NOR gate is an output signal terminal while the other input terminal is coupled to the output terminal of the inverter. The source terminal of the PMOS transistor is coupled to a source voltage. The drain terminal of the PMOS transistor is coupled to the input/output pad. The source terminal of the NMOS transistor is coupled to a low voltage potential. The drain terminal of the NMOS transistor is coupled to the input/output pad. The gate terminal of the NMOS transistor is coupled to the output terminal of the NOR gate. Both the drain terminal and the gate terminal of the first NMOS transistor are coupled to the source voltage. The source terminal of the first PMOS transistor is coupled to the drain terminal of the first NMOS transistor. The drain terminal and n-well of the first PMOS transistor are coupled to the source terminal of the first NMOS transistor as well as the n-well of the PMOS transistor. The gate terminal of the second PMOS transistor is coupled to the source voltage. The source terminal of the second PMOS transistor is coupled to the input/output pad. The drain and the n-well of the second PMOS transistor are coupled to the drain terminal of the first PMOS transistor. The gate terminal of the second NMOS transistor is connected to the source voltage. The source terminal of the second NMOS transistor is coupled to the input/output pad. The drain terminal of the second NMOS transistor is coupled to the gate terminal of the first PMOS transistor. The gate terminal of the third PMOS transistor is connected to the source voltage. The drain terminal of the third PMOS transistor is coupled to the gate terminal of the first PMOS transistor. The n-well of the third PMOS transistor is coupled to the drain terminal of the first PMOS transistor. The source terminal of the third PMOS transistor is coupled to the input/output pad. The n-well of the fourth PMOS transistor is coupled to the drain terminal of the first PMOS transistor. The source terminal of the fourth PMOS transistor is coupled to the output terminal of the NAND gate. The drain terminal of the third NMOS transistor is coupled to the source terminal of the fourth PMOS transistor. The source terminal of the third NMOS transistor is coupled to the drain terminal of the fourth PMOS transistor as well as the gate terminal of the PMOS transistor. The gate terminal of the third NMOS transistor is connected to the source voltage. The n-well of the fifth PMOS transistor is coupled to the drain terminal of the first PMOS transistor. The gate terminal of the fifth PMOS transistor is connected to the source voltage. The drain terminal of the fifth PMOS transistor is coupled to the drain terminal of the fourth PMOS transistor. The source terminal of the fifth PMOS transistor is coupled to the input/output pad. The gate terminal of the sixth PMOS transistor is connected to the source voltage. The n-well of the sixth PMOS transistor is coupled to the drain terminal of the first PMOS transistor. The drain terminal of the sixth PMOS transistor is coupled to the gate terminal of the fourth PMOS transistor. The source terminal of the sixth PMOS transistor is coupled to the input/output pad. The gate terminal of the fourth NMOS transistor is connected to the source voltage. The drain terminal of the fourth NMOS transistor is coupled to the gate terminal of the fourth PMOS transistor. The source terminal of the fourth NMOS transistor is coupled to the input/output pad.

In a third embodiment of this invention, a CMOS input/output control circuit capable of tolerating a range of input voltage is provided. The circuit includes a NAND gate, an inverter, a NOR gate, a PMOS transistor, an NMOS transistor, an input/output pad, a first PMOS transistor, a second PMOS transistor, a third PMOS transistor, a fourth PMOS transistor, a fifth PMOS transistor, a sixth PMOS transistor, a first NMOS transistor, a second NMOS transistor, a third NMOS transistor and a fourth NMOS transistor. One of the input terminals of the NAND gate is an output enable signal terminal. The other input terminal of the NAND gate is an output signal terminal. The input terminal of the inverter is coupled to the output enable signal terminal. One of the input terminals of the NOR gate is an output signal terminal while the other input terminal is coupled to the output terminal of the inverter. The source terminal of the PMOS transistor is coupled to a source voltage. The drain terminal of the PMOS transistor is coupled to the input/output pad. The source terminal of the NMOS transistor is coupled to a low voltage potential. The drain terminal of the NMOS transistor is coupled to the input/output pad. The gate terminal of the NMOS transistor is coupled to the output terminal of the NOR gate. Both the drain terminal and the gate terminal of the first NMOS transistor are coupled to the source voltage. The source terminal of the first PMOS transistor is coupled to the drain terminal of the first NMOS transistor. The drain terminal and n-well of the first PMOS transistor are coupled to the source terminal of the first NMOS transistor as well as the n-well of the PMOS transistor. The gate terminal of the second PMOS transistor is coupled to the source voltage. The source terminal of the second PMOS transistor is coupled to the input/output pad. The drain and the n-well of the second PMOS transistor are coupled to the drain terminal of the first PMOS transistor. The n-well of the fourth PMOS is coupled to the drain terminal of the first PMOS transistor. The source terminal of the fourth PMOS transistor is coupled to the output terminal of the NAND gate. The drain terminal of the third NMOS transistor is coupled to the source terminal of the fourth PMOS transistor. The source terminal of the third NMOS transistor is coupled to the drain terminal of the fourth PMOS transistor as well as the gate terminal of the PMOS. The gate terminal of the third NMOS transistor is connected to the source voltage. The n-well of the fifth PMOS transistor is coupled to the drain terminal of the first PMOS transistor. The gate terminal of the fifth PMOS transistor is connected to the source voltage. The drain terminal of the fifth PMOS transistor is coupled to the drain terminal of the fourth PMOS transistor. The source terminal of the fifth PMOS transistor is coupled to the input/output pad. The gate terminal of the sixth PMOS transistor is connected to the source voltage. The n-well of the sixth PMOS transistor is coupled to the drain terminal of the first PMOS transistor. The drain terminal of the sixth PMOS transistor is coupled to the gate terminal of the fourth PMOS transistor and the gate terminal of the first PMOS transistor. The source terminal of the sixth PMOS transistor is coupled to the input/output pad. The gate terminal of the fourth NMOS transistor is connected to the source voltage. The drain terminal of the fourth NMOS transistor is the gate terminal of the fourth PMOS transistor. The source terminal of the fourth NMOS transistor is coupled to the input/output pad.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 3:
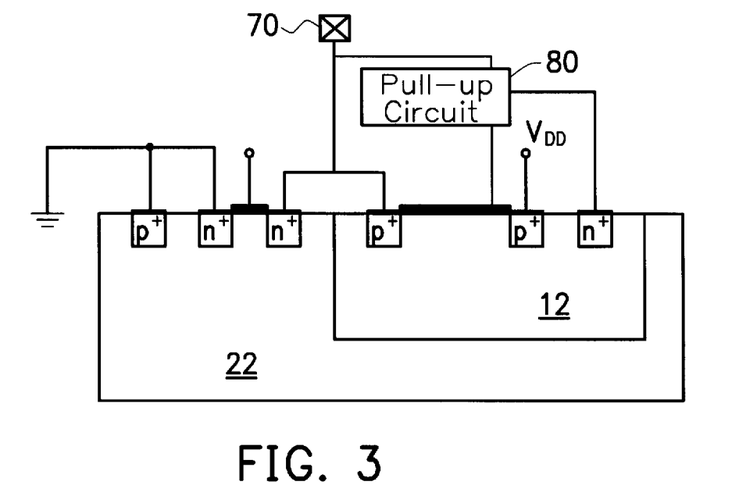
FIG. 3 is a schematic cross-sectional view of a CMOS transistor according to this invention showing the state of connection when the voltage applied to the input/output pad is greater than source voltage.

FIG. 3 is a schematic cross-sectional view of a CMOS transistor according to this invention showing the state of connection when the voltage applied to the input/output pad is greater than source voltage. When the input/output control CMOS functions as an output device, the PMOS transistor and the NMOS transistor must be turned off at the same time. The NMOS is turned off whenever a low voltage is applied to the gate of the NMOS transistor. However, to ensure that the PMOS transistor is turned off, a pull-up circuit 80 is needed to boost the gate voltage of the PMOS transistor up to a voltage level identical to that at the input/output pad 70. In order to prevent failure of the PMOS transistor, this pull-up circuit 80 must transfer the voltage at the input/output pad 70 to the n-well. In other words, a voltage from the input/output pad must be fed to the substrate of the PMOS transistor.

Figure 4:
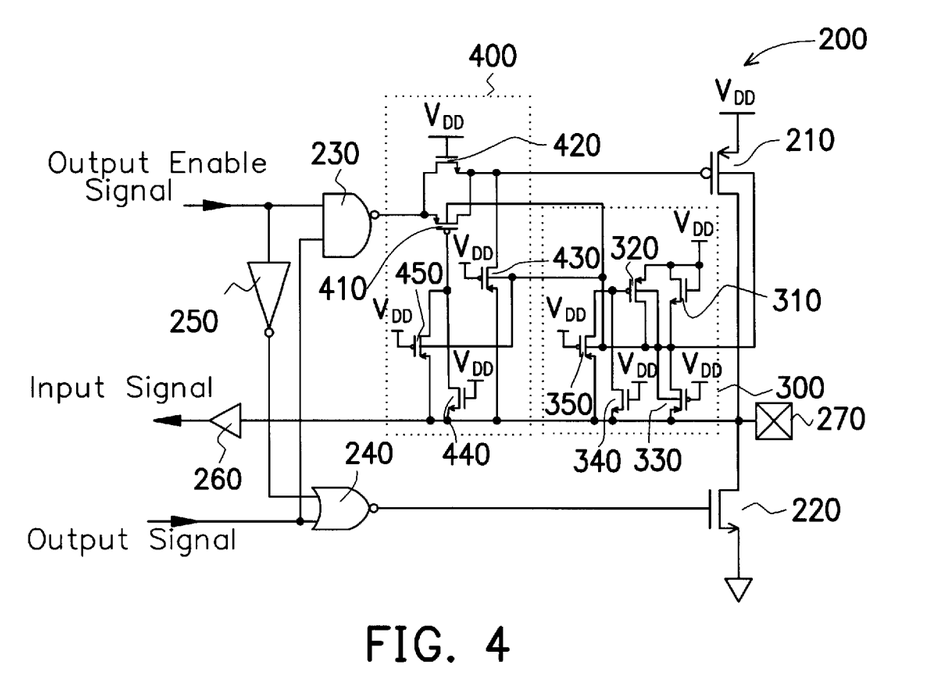
FIG. 4 is a CMOS input/output control circuit according to a first preferred embodiment of this invention.

FIG. 4 is a CMOS input/output control circuit according to a first preferred embodiment of this invention. The main difference between the CMOS input/output control circuit 200 of this invention and a conventional circuit is that a n-well control circuit 300 and a gate control circuit 400 are incorporated. Hence, through the circuits 300 and 400, voltages at the gate and the base voltage of the PMOS transistor 210 are raised to 5 V when a 5 V is applied to the input/output pad 270.

The base control circuit 300 includes a first NMOS transistor 310, a first PMOS transistor 320, a second PMOS transistor 330, a second NMOS transistor 340 and a third PMOS transistor 350. The drain terminal of the first NMOS transistor 310 is connected to the source terminal of the first PMOS transistor, the gate terminal of the first NMOS transistor 310 and a source voltage $V_{DD}$ (according to this embodiment, $V_{DD}$=3.3V). The source terminal of the first NMOS transistor 310 is connected to the drain terminal and the n-well of the first PMOS transistor 320. The gate terminal of the second PMOS transistor 330 is connected to the source voltage $V_{DD}$. The source terminal of the second PMOS transistor 330 is connected to the input/output pad 270. The drain terminal and the n-well of the second PMOS transistor 330 are connected to the drain terminal of the first PMOS transistor 320. The gate terminal of the second NMOS transistor 340 is connected to the source voltage $V_{DD}$. The source terminal of the second NMOS transistor 340 is connected to input/output pad 270. The drain terminal of the second NMOS transistor 340 is connected to the gate terminal of the first PMOS transistor 320. The gate terminal of the third PMOS transistor 350 is connected to source voltage $V_{DD}$. The drain terminal of the third PMOS transistor 350 is connected to the gate terminal of the first PMOS transistor 320. The n-well of the third PMOS transistor 350 is connected to the drain terminal of the first PMOS transistor 320. The source terminal of the third PMOS transistor 350 is connected to the input/output pad 270. The drain terminal of the first PMOS transistor 320 is connected to the n-well of the PMOS transistor 210 for controlling the base voltage of the PMOS transistor 210.

The gate control circuit 400 includes a fourth PMOS transistor 410, a third NMOS transistor 420, a fifth PMOS transistor 430, a fourth NMOS transistor 440 and a sixth PMOS transistor 450. The source terminal of the fourth PMOS transistor 410 is connected to the drain terminal of the third NMOS transistor 420 serving as an input terminal for connecting to the output terminal of a NAND gate 230. The drain terminal of the fourth PMOS transistor 410 is connected to the source terminal of the third NMOS transistor 420 serving as an output terminal for connecting to the gate terminal of the PMOS transistor 210. The n-well of the fourth PMOS transistor 410 is connected to the drain terminal of the first PMOS transistor 320. The gate terminal of the third NMOS transistor 420 is connected to the source voltage $V_{DD}$. The n-well of the fifth PMOS transistor 430 is connected to the drain terminal of the first PMOS transistor 320. The gate terminal of the fifth PMOS transistor 430 is connected to the source voltage $V_{DD}$. The drain terminal of the fifth PMOS transistor 430 is connected to the drain terminal of the fourth PMOS transistor 410. The source terminal of the fifth PMOS transistor 430 is connected to the input/output pad 270. The gate terminal of the sixth PMOS transistor 450 is connected to the source voltage $V_{DD}$. The n-well of the sixth PMOS transistor 450 is connected to the drain terminal of the first PMOS transistor 320. The drain terminal of the sixth PMOS transistor 450 is connected to the gate terminal of the fourth PMOS transistor 410. The source terminal of the sixth PMOS transistor 450 is connected to the input/output pad 270. The gate terminal of the fourth NMOS transistor 440 is connected to the source voltage $V_{DD}$. The drain terminal of the fourth NMOS transistor 440 is connected to the gate terminal of the fourth PMOS transistor 410. The source terminal of the fourth NMOS transistor 440 is connected to the input/output pad 270.

Figure 5:
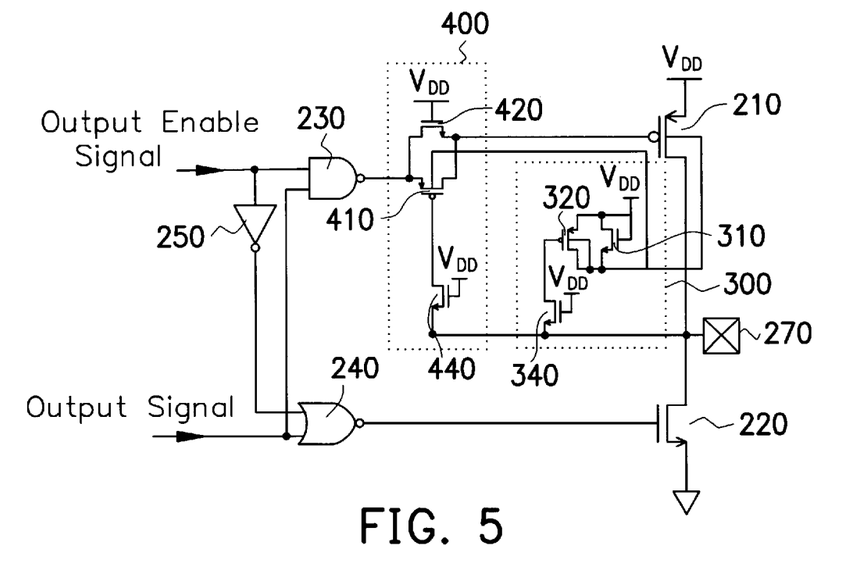
FIG. 5 is an equivalent circuit diagram of the CMOS input/output control circuit of this invention when the control circuit functions as an output device.

The CMOS input/output control circuit of this invention can be used for signal output and signal input. FIG. 5 is an equivalent circuit diagram of the CMOS input/output control circuit of this invention when the control circuit functions as a signal output device. Since the CMOS input/output control circuit functions as an output device, the highest voltage on the input/output pad 270 is the source voltage $V_{DD}$ (3.3 V). Hence, all the PMOS transistors 330, 350, 430 and 450 (FIG. 4) inside the n-well control circuit 300 and the gate control circuit 400, which have direct connection with the input/output pad 270, are off (because $V_{GS}=0>V_{tp}$).

A high potential (this high potential is equivalent to the source voltage $V_{DD}$ of 3.3 V) is applied to the output enable signal terminal. If the output signal is also at a high potential level, the NAND gate 230 and the NOR gate 240 produce a low potential. Inside the n-well control circuit 300, the first NMOS transistor 310 is turned on. Hence, source voltage $V_{DD}$ is capable of transmitting to the n-well of the PMOS transistor 210. In other words, the substrate of the PMOS transistor 210 is connected to the voltage source $V_{DD}$. Inside the control gate circuit 400, since the third MOS transistor 420 is on, a low output potential is transmitted from the NAND gate 230 to the gate terminal of the PMOS transistor 210. Hence, the PMOS transistor 210 is turned on. Meanwhile, the NMOS transistor 220 is off because a low potential is issued from the NOR gate 240 to the gate terminal of the NMOS transistor 220. Consequently, a high voltage level (at source voltage $V_{DD}$) is produced at the input/output pad 270.

Conversely, if the output signal is at a low potential level, both the NAND gate 230 and the NOR gate 240 produce a high potential. Inside the n-well control circuit 300, since the first NMOS transistor 310 is on, source voltage $V_{DD}$ is able to transmit to the n-well of the PMOS transistor 210. In other words, the substrate of the PMOS transistor 210 is directly connected to the source voltage $V_{DD}$. Inside the gate control circuit 400, since the third NMOS transistor 420 is on, the high potential from the NAND gate 230 is transmitted to the gate terminal of the PMOS transistor 210. Hence, the PMOS transistor 210 is turned off. Meanwhile, the NMOS transistor 220 is on because a high potential is transferred from the NOR gate 240 to the gate terminal of the NMOS transistor 220. Consequently, a low potential is produced at the input/output pad 270.

Figure 6:
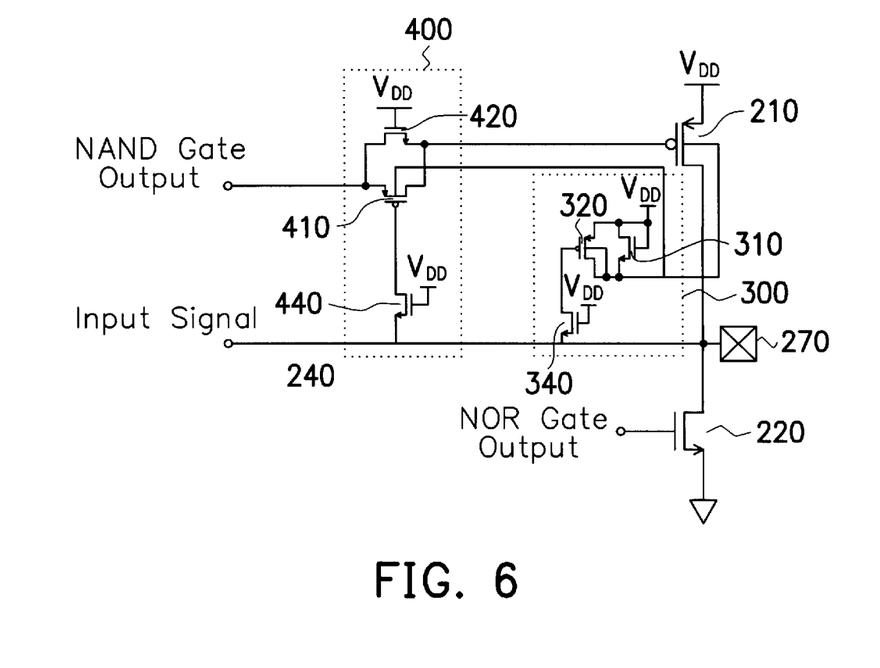
FIG. 6 is an equivalent circuit diagram of the CMOS input/output control circuit of this invention when the input voltages are 0 V, 2.5 V and 3.3 V, respectively.

FIG. 6 is an equivalent circuit diagram of the CMOS input/output control circuit of this invention when the input voltages are 0 V, 2.5 V and 3 V, respectively. Since the CMOS input/output control circuit functions as an input device, the highest voltage on the input/output pad 270 is the source voltage $V_{DD}$ (3.3 V). Hence, all the PMOS transistors 330, 350, 430 and 450 (FIG. 4) inside the n-well control circuit 300 and the gate control circuit 400, which have direct connection with the input/output pad 270, are off (because $V_{GS}=0>V_{tp}$).

Since a low potential is applied to the output enable signal terminal, a high potential is output from the NAND gate. Inside the n-well control circuit 300, since the first NMOS transistor 310 is on, source voltage $V_{DD}$ is transferred to the n-well of the PMOS transistor 210. This is equivalent to the substrate of the PMOS transistor 210 being directly attached to the source voltage $V_{DD}$. Inside the gate control circuit 400, since the third NMOS transistor 420 is on, the high potential from the NAND gate 230 is transmitted to the gate terminal of the PMOS transistor 210. Hence, the PMOS transistor 210 is off. Meanwhile, the NMOS transistor 220 is off because a low potential is transferred from the NOR gate 240 to the gate terminal of the NMOS transistor 220. Consequently, any signals placed on the input/output pad 270 can be redirected to the internal circuit of some device as input signals.

Figure 7:
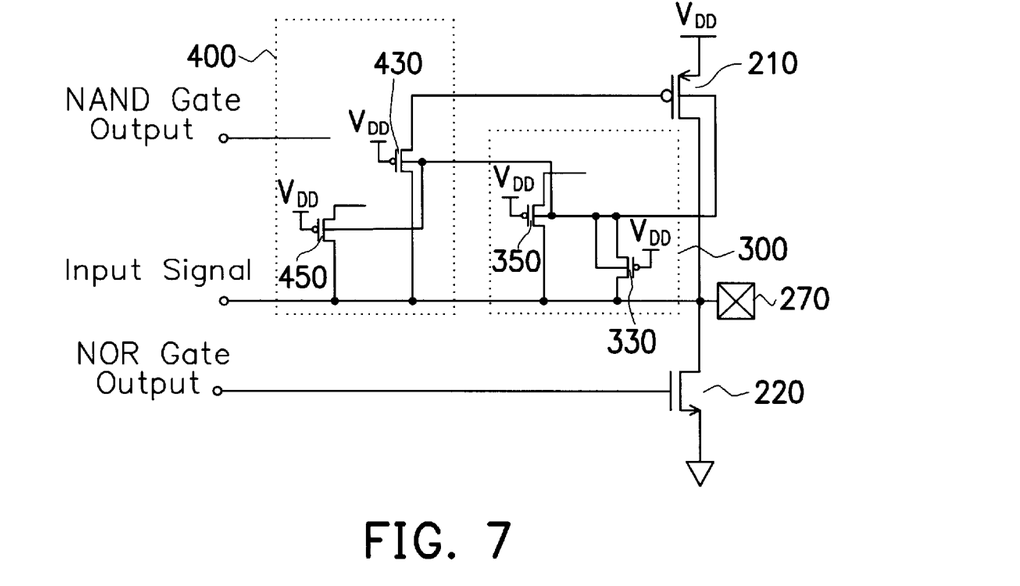
FIG. 7 is an equivalent circuit diagram of the CMOS input/output control circuit of this invention when the input voltage is 5 V.

FIG. 7 is an equivalent circuit diagram of the CMOS input/output control circuit of this invention when the input voltage is 5 V. The CMOS input/output control circuit functions as an input device. Moreover, highest voltage at the input/output pad 270 is 5 V, which is higher than the source voltage $V_{DD}$.

Inside the n-well control circuit 300, the second PMOS transistor 330 is on, leading to the shutting of the first NMOS transistor 310 (because $V_{tn}>V_{GS}$). On the other hand, the third PMOS transistor 350 is on, and hence the first PMOS transistor 320 is off ($V_{tp}<V_{GS}$) because its gate receives 5 V. Therefore, 5 V are applied to the n-well well of the PMOS transistor 210. In other words, the substrate of the PMOS transistor 210 is now connected to 5 V.

Similarly, the fifth PMOS transistor 430 inside the gate control circuit 400 is on leading to the shutting of the third NMOS transistor 310 ($V_{tn}>V_{GS}$). Meanwhile, the sixth PMOS transistor 450 is on, and hence the fourth PMOS transistor 410 is shut ($V_{tp}<V_{GS}$) because its gate receives 5 V. Therefore, 5V are applied to the gate of the PMOS transistor 210 and the PMOS transistor 210 is switched off. In fact, the 5 V at the input/output pad 270 can be regarded as a high input potential of just 3.3 V as long as a simple clamping circuit is also installed inside the internal circuit.

In the first preferred embodiment of this invention (circuit shown in FIG. 4), the third PMOS transistor 350 and the second NMOS transistor 340 of the n-well control circuit 300 have a function similar to the sixth PMOS transistor 450 and the fourth NMOS transistor 440 of the gate control circuit 400. In a second preferred embodiment of this invention, the third PMOS transistor 350 and the second NMOS transistor 340 of the n-well control circuit 300 used in the first preferred embodiment are eliminated.

Figure 8:
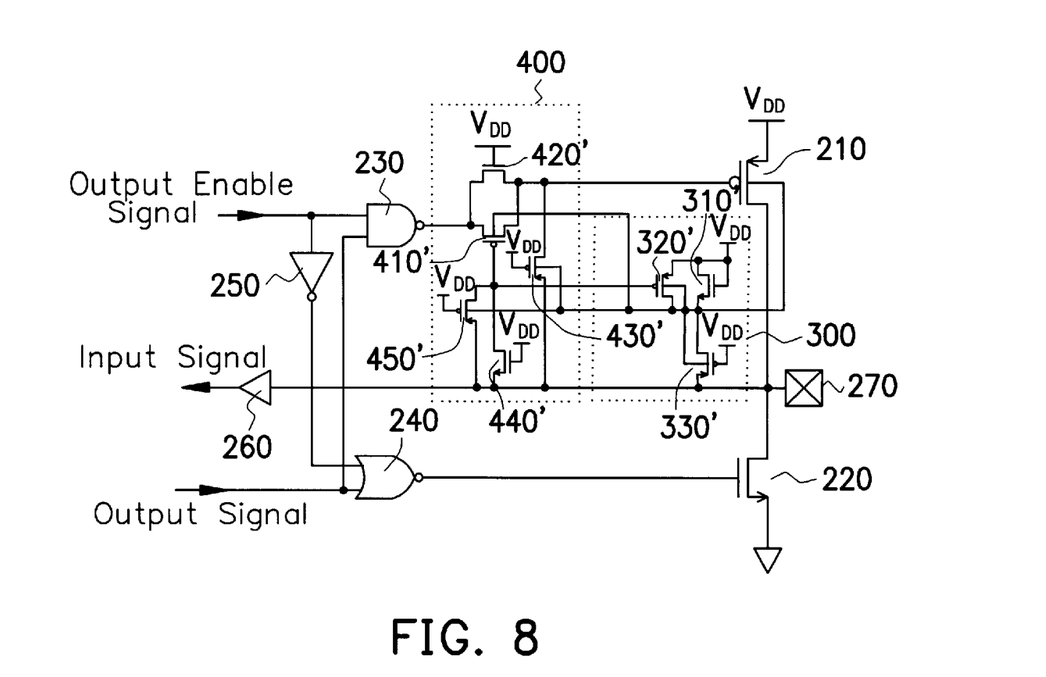
FIG. 8 is a CMOS input/output control circuit according to a second preferred embodiment of this invention.

FIG. 8 is a CMOS input/output control circuit according to the second preferred embodiment of this invention. The only difference between the circuit in the first and the second embodiment is that the drain terminal of the sixth PMOS transistor 450' is connected to the gate terminal of the first PMOS transistor 320'. Since the mode of operation in the second embodiment is very similar to the first embodiment, detailed description is not repeated here.

Similarly, in a third preferred embodiment of this invention, the sixth PMOS transistor 450 and the fourth NMOS transistor 440 of the gate control circuit 400 (rather than the third PMOS transistor 350 and the second NMOS transistor 340 in the second embodiment) are eliminated.

Figure 9:
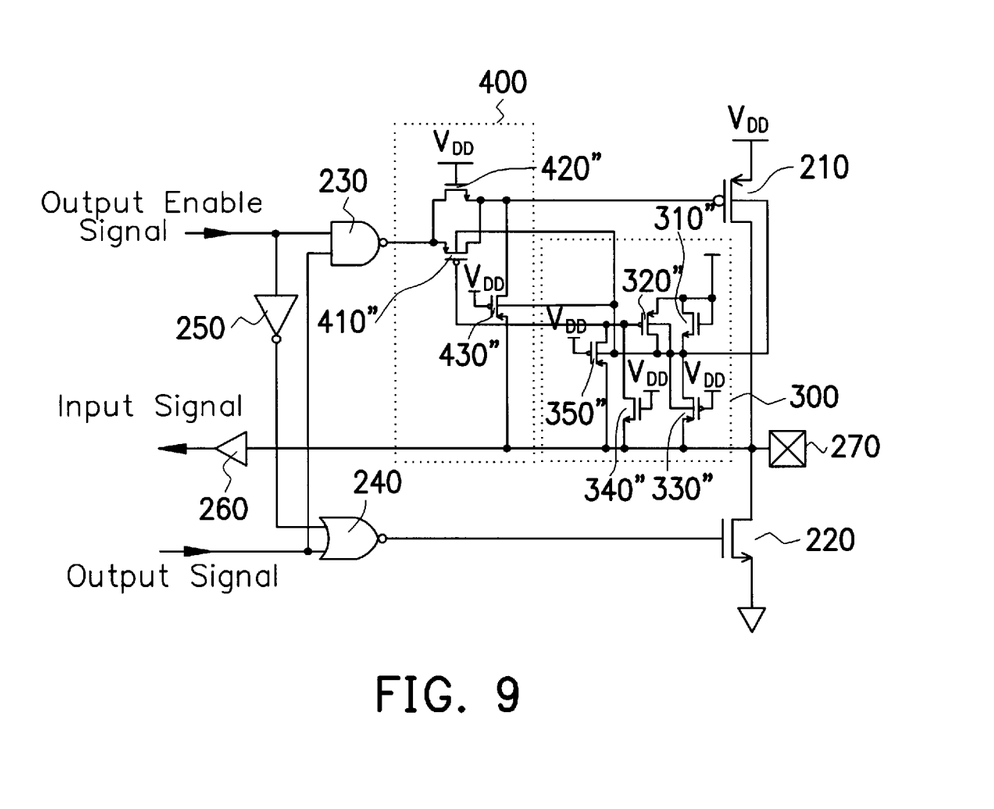
FIG. 9 is a CMOS input/output control circuit according to a third preferred embodiment of this invention.

FIG. 9 is a CMOS input/output control circuit according to the third preferred embodiment of this invention. The only difference between the circuit in the first and the third preferred embodiment is that the drain terminal of the third PMOS transistor 350" is connected to the gate terminal of the fourth PMOS transistor 410". Since the mode of operation in the third embodiment is very similar to the first embodiment, detailed description is not repeated here.

Figure 10:
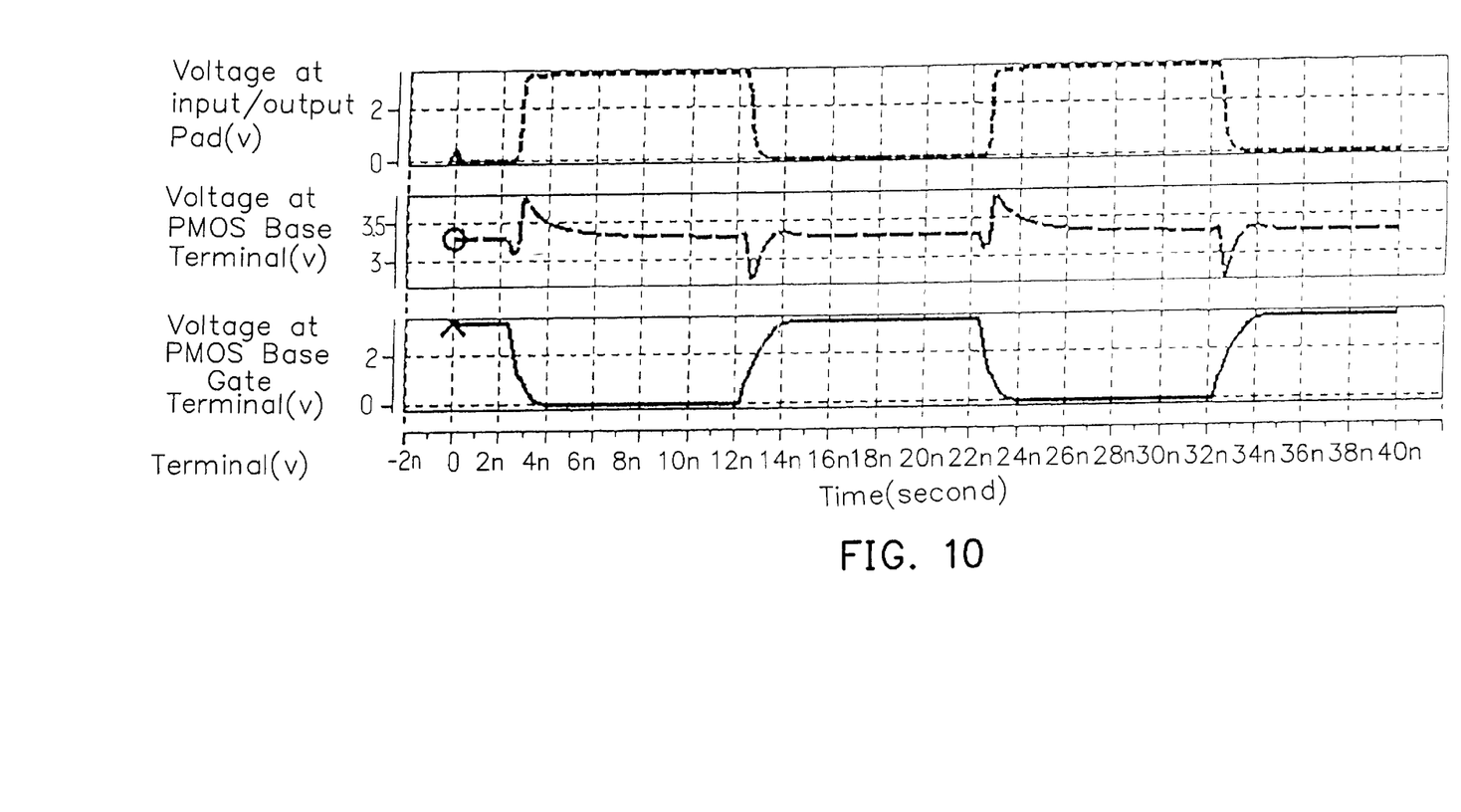
FIG. 10 is a graph showing signal output at the input/output pad, the gate terminal and the n-well of the PMOS transistor for a CMOS input/output control circuit of this invention functioning as an output device.

FIG. 10 is a graph showing signal output at the input/output pad, the gate terminal and the n-well of the PMOS transistor for a CMOS input/output control circuit of this invention functioning as an output device. In FIG. 10, when the gate terminal of the PMOS transistor is at 3.3 V, the input/output pad is at 0 V (the NMOS transistor is on). On the other hand, when the gate terminal of the PMOS transistor is at 0 V, the input/output pad is at 3.3 V (the PMOS transistor is on) and the n-well of the PMOS transistor is at 3.3 V also.

Figure 11:
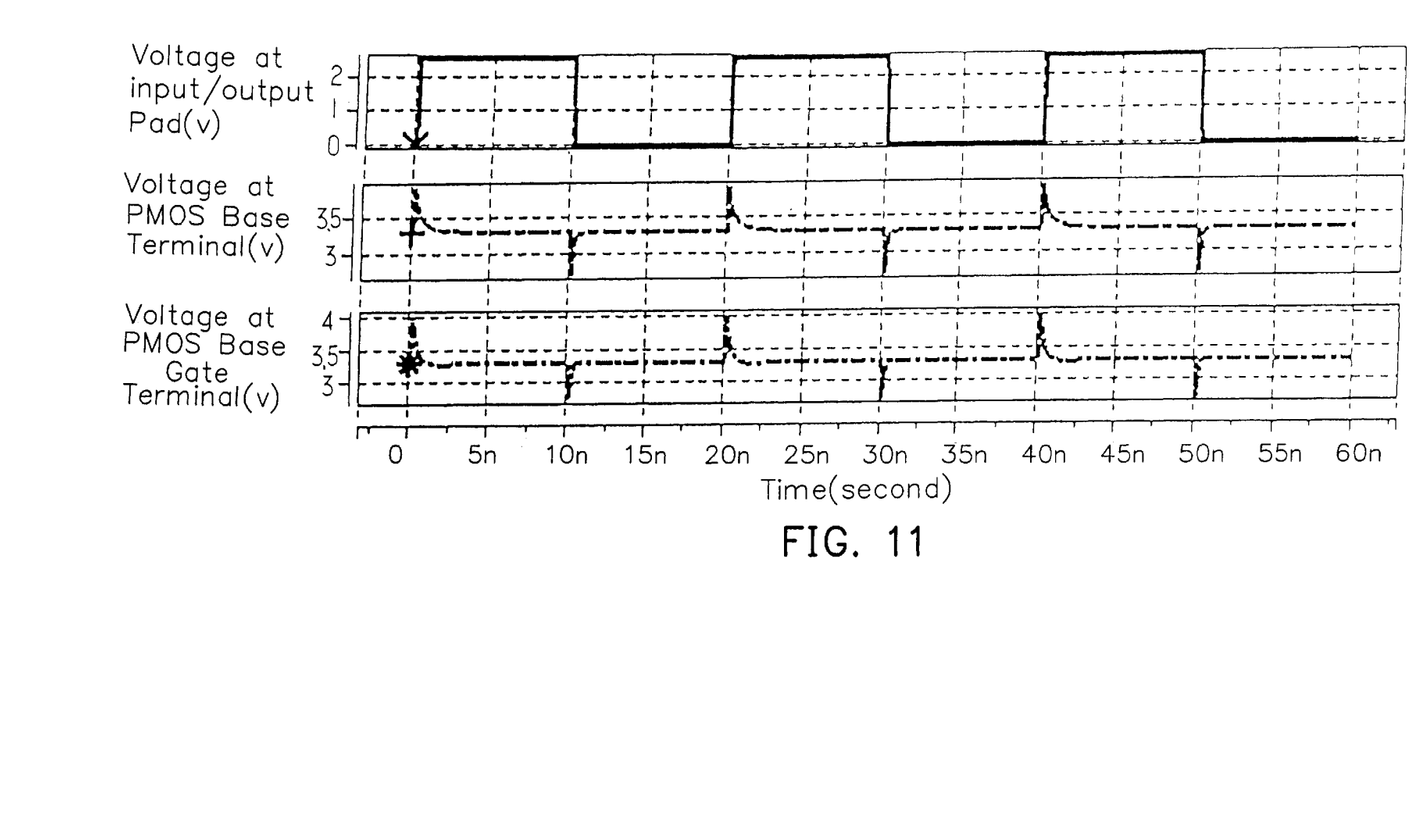
FIG. 11 is a graph showing signal output at the input/output pad, the gate terminal and the n-well of the PMOS transistor for a CMOS input/output control circuit of this invention functioning as an input device with an input high voltage of 2.5 V.

FIG. 11 is a graph showing signal output at the input/output pad, the gate terminal and the n-well of the PMOS transistor for a CMOS input/output control circuit of this invention functioning as an input device with an input high voltage of 2.5 V. In FIG. 11, when the input/output pad is used as an input terminal, the gate terminal of the PMOS transistor and the n-well of the PMOS transistor are at 3.3 V. Meanwhile, the PMOS transistor is shut.

Figure 12:
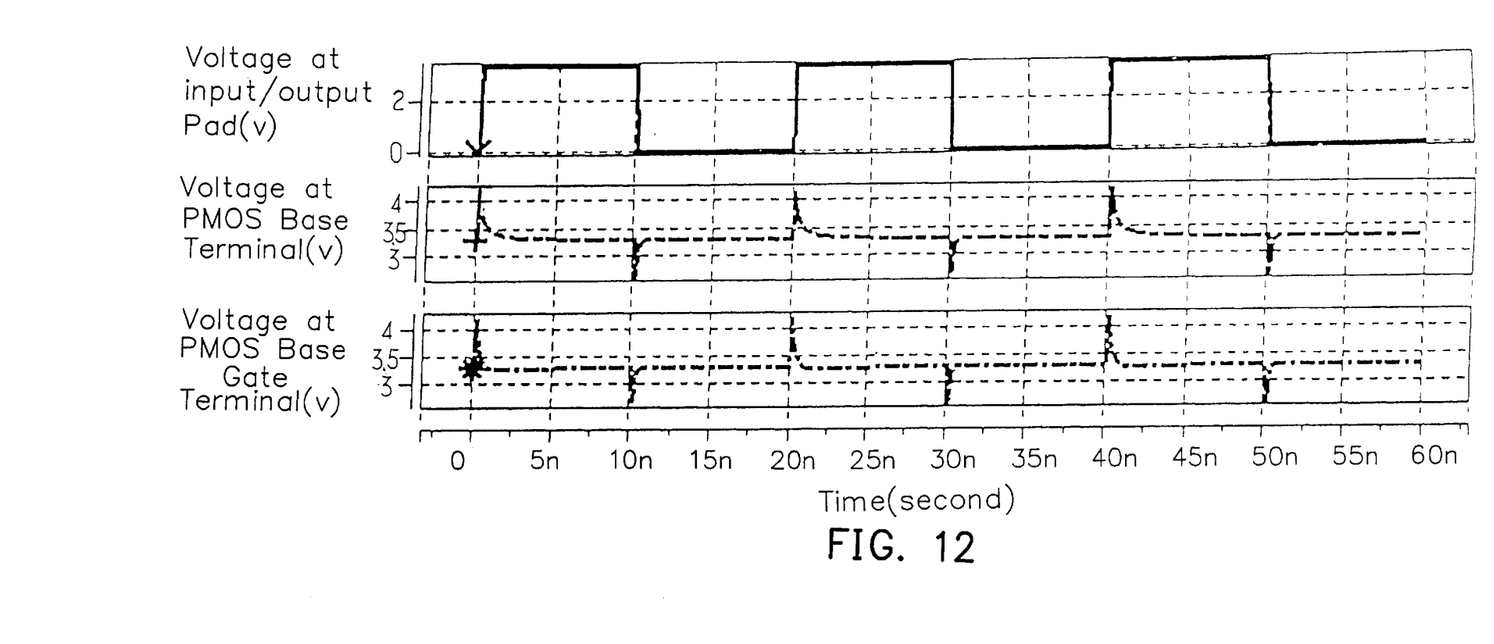
FIG. 12 is a graphs showing signal output at the input/output pad, the gate terminal and the n-well of the PMOS transistor for a CMOS input/output control circuit of this invention functioning as an input device with an input high voltage of 3.3 V.

FIG. 12 is a graph showing signal output at the input/output pad, the gate terminal and the n-well of the PMOS transistor for a CMOS input/output control circuit of this invention functioning as an input device with an input high voltage of 3.3 V. In FIG. 12, when the input/output pad is used as an input terminal, both the gate terminal and the n-well of the PMOS transistor are maintained at 3.3 V. Meanwhile, the PMOS transistor is shut.

Figure 13:
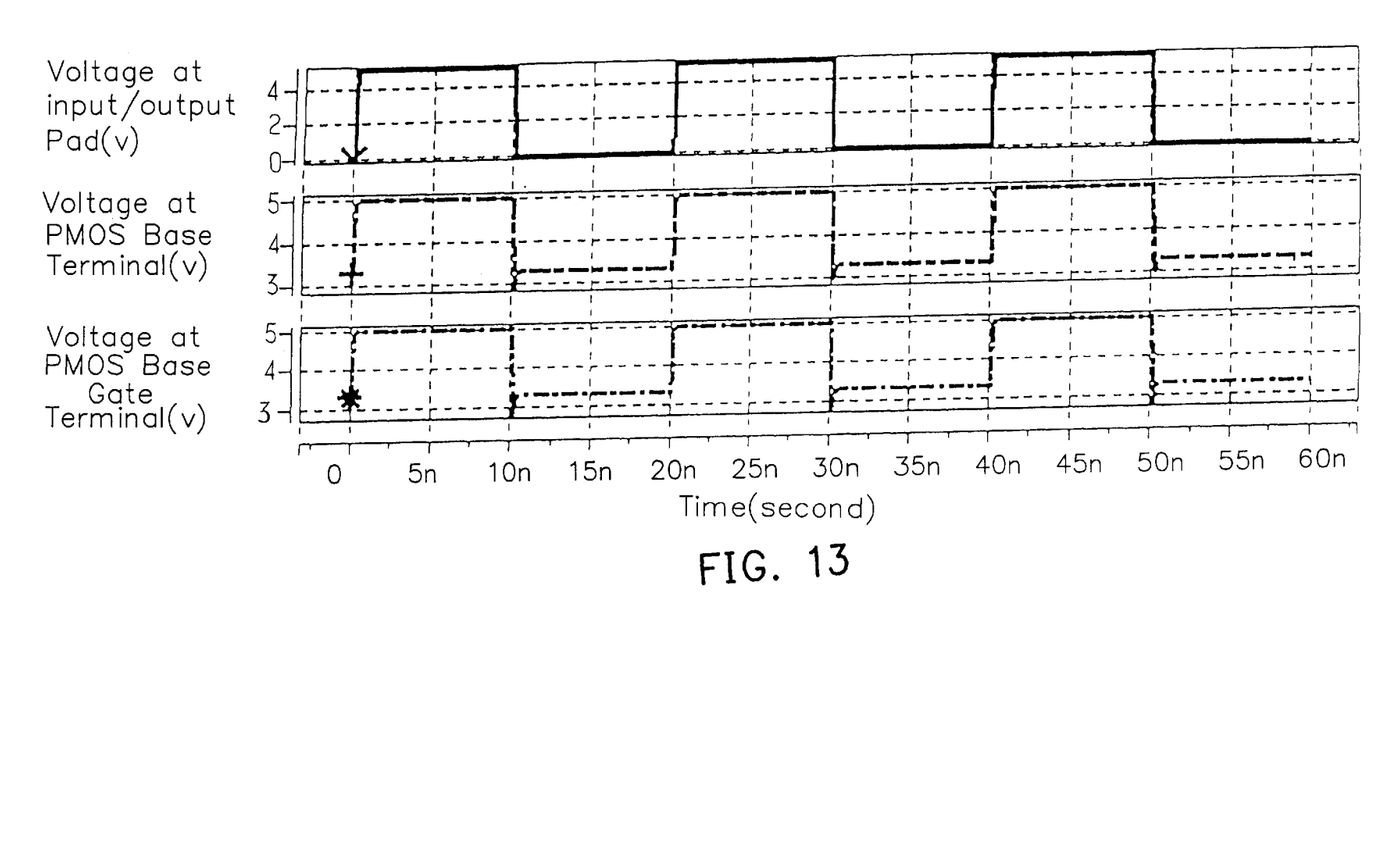
FIG. 13 is a graph showing signal output at the input/output pad, the gate terminal and the n-well of the PMOS transistor for a CMOS input/output control circuit of this invention functioning as an input device with an input high voltage of 5 V.

FIG. 13 is a graph showing signal output at the input/output pad, the gate terminal and the n-well of the PMOS transistor for a CMOS input/output control circuit of this invention functioning as an input device with an input high voltage of 5 V. In FIG. 13, when the input/output pad is at 5 V, the gate terminal and the n-well of the PMOS transistor are at 5 V as well. On the other hand, when the input/output pad is at 0 V, the gate terminal and the n-well of the PMOS transistor will be maintained at 3.3V. Meanwhile, the PMOS transistor is shut.

In summary, this invention provides a CMOS input/output control circuit capable of tolerating different input operating voltages such as 2.5 V, 3.3 V and 5 V. A second advantage of this invention is that through the incorporation of a n-well control circuit and a gate control circuit, the PMOS transistor within the n-well is shut, thereby permitting 5 V input.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A CMOS input/output control circuit capable of tolerating different input voltages, comprising:

a NAND gate, wherein one input terminal of the NAND gate is an output enable signal terminal, and another input terminal of the NAND gate is an output signal terminal;

an inverter, wherein an input terminal of the inverter is connected to the output enable signal terminal;

a NOR gate, wherein one input terminal of the NOR gate is the output signal terminal, and another terminal of the NOR gate is connected to the output terminal of the inverter;

a PMOS transistor, wherein a source terminal of the PMOS transistor is connected to a source voltage, and a drain terminal of the PMOS transistor is connected to an input/output pad;

an NMOS transistor, wherein a source terminal of the NMOS transistor is connected to a low potential, a drain terminal of the NMOS transistor is connected to the input/output pad, and a gate terminal of the NMOS transistor is connected to the output terminal of the NOR gate;

a first NMOS transistor, wherein a drain terminal and a gate terminal of the first NMOS transistor are connected to the source voltage;

a first PMOS transistor, wherein a source terminal of the first PMOS transistor is connected to the drain terminal of the first NMOS transistor, and a drain terminal and a n-well of the first PMOS transistor are connected to a source terminal of the first NMOS transistor as well as a n-well of the PMOS transistor;

a second PMOS transistor, wherein a gate terminal of the second PMOS transistor is connected to the source voltage, a source terminal of the second PMOS transistor is connected to the input/output pad, and a drain terminal and a n-well of the second PMOS transistor are connected to the drain terminal of the first PMOS transistor;

a third PMOS transistor, wherein a n-well of the third PMOS transistor is connected to the drain terminal of the first PMOS transistor, and a source terminal of the third PMOS transistor is connected to the output signal terminal of the NAND gate;

a second NMOS transistor, wherein a drain terminal of the second NMOS transistor is connected to the source terminal of the third PMOS transistor, a source terminal of the second NMOS transistor is connected to a drain terminal of the third PMOS transistor as well as a gate terminal of the PMOS transistor, and a gate terminal of the second NMOS transistor is connected to the source voltage;

a fourth PMOS transistor, wherein a n-well of the fourth PMOS transistor is connected to the drain terminal of the first PMOS transistor, a gate terminal of the fourth PMOS transistor is connected to the source voltage, a drain terminal of the fourth PMOS transistor is connected to the drain terminal of the third PMOS transistor, and a source terminal of the fourth PMOS transistor is connected to the input/output pad;

a fifth PMOS transistor, wherein a gate terminal of the fifth PMOS transistor is connected to the source voltage, a n-well of the fifth PMOS transistor is connected to the drain terminal of the first PMOS transistor, a drain terminal of the fifth PMOS transistor is connected to a gate terminal of the third PMOS transistor as well as a gate terminal of the first PMOS transistor, and a source terminal of the fifth PMOS transistor is connected to the input/output pad; and a third NMOS transistor, wherein a gate terminal of the third NMOS transistor is connected to the source voltage, a drain terminal of the third NMOS transistor is connected to the gate terminal of the third PMOS transistor, and the source terminal of the third NMOS transistor is connected to the input/output pad.

2. A CMOS input/output control circuit capable of tolerating different input voltages, comprising:

an n-well control circuit coupled to an n-well of a PMOS transistor and an input/output pad for raising the n-well of the PMOS transistor to the input voltage level when the input voltage is greater than a source voltage, wherein the n-well control circuit comprises;

a first NMOS transistor, wherein a drain terminal and the gate terminal of the first NMOS transistor are connected to the source voltage;

a first PMOS transistor, wherein a source terminal of the first PMOS transistor is connected to the drain terminal of the first NMOS transistor, and a drain terminal and a gate terminal of the first PMOS transistor are connected to a source terminal of the first NMOS transistor as well as the n-well of the PMOS transistor;

a second PMOS transistor, wherein a gate terminal of the second PMOS transistor is connected to the source voltage, a source terminal of the second PMOS transistor is connected to the input/output pad, and a drain and an n-well of the second PMOS transistor are connected to the drain terminal of the first PMOS transistor;

a second NMOS transistor, wherein a gate terminal of the second NMOS transistor is connected to the source voltage, a source terminal of the second NMOS transistor is connected to the input/output pad, and a drain terminal of the second NMOS transistor is connected to the gate terminal of the first PMOS transistor; and a third PMOS transistor, wherein a gate terminal of the third PMOS transistor is connected to the source voltage, a drain terminal of the third PMOS transistor is connected to the gate terminal of the first PMOS transistor, an n-well of the third PMOS transistor is connected to the drain terminal of the first PMOS transistor, and a source terminal of the third PMOS transistor is connected to the input/output pad; and a gate control circuit coupled to a gate terminal of the PMOS transistor and the input/output pad for raising the gate terminal of the PMOS transistor to the input voltage level when the input voltage is greater than the source voltage.

3. The CMOS input/output control circuit of claim 2, wherein the gate control circuit includes:

a fourth PMOS transistor, wherein a n-well of the fourth PMOS transistor is connected to the drain terminal of the first PMOS transistor and a source terminal of the fourth PMOS transistor is connected to an output terminal of a NAND gate;

a third NMOS transistor, wherein a drain terminal of the third NMOS transistor is connected to the source terminal of the fourth PMOS transistor, a source terminal of the third NMOS transistor is connected to a drain terminal of the fourth PMOS transistor as well as the gate terminal of the PMOS transistor, and a gate terminal of the third NMOS transistor is connected to the source voltage;

a fifth PMOS transistor, wherein a n-well of the fifth PMOS transistor is connected to the drain terminal of the first PMOS transistor, a gate terminal of the fifth PMOS transistor is connected to the source voltage, a drain terminal of the fifth PMOS transistor is connected to the drain terminal of the fourth PMOS transistor, and a source terminal of the fifth PMOS transistor is connected to the input/output pad;

a sixth PMOS transistor, wherein a gate terminal of the sixth PMOS transistor is connected to the source voltage, a n-well of the sixth PMOS transistor is connected to the drain terminal of the first PMOS transistor, a drain terminal of the sixth PMOS transistor is connected to a gate terminal of the fourth PMOS transistor, and a source terminal of the sixth PMOS transistor is connected to the input/output pad; and a fourth NMOS transistor, wherein a gate terminal of the fourth NMOS transistor is connected to the source voltage, a drain terminal of the fourth NMOS transistor is connected to the gate terminal of the fourth PMOS transistor, and a source terminal of the fourth NMOS transistor is connected to the input/output pad.

4. A CMOS input/output control circuit capable of tolerating different input voltages, comprising:

an n-well control circuit coupled to an n-well of a PMOS transistor and an input/output pad for raising the n-well of the PMOS transistor to the input voltage level when the input voltage is greater than a source voltage, wherein the n-well control circuit comprises;

a first NMOS transistor, wherein a drain terminal and a gate terminal of the first NMOS transistor are connected to the source voltage;

a first PMOS transistor, wherein a source terminal of the first PMOS transistor is connected to the drain terminal of the first NMOS transistor, and a drain terminal and an n-well of the first PMOS transistor are connected to a source terminal of the first NMOS transistor as well as the n-well of the PMOS transistor;

a second PMOS transistor, wherein a gate terminal of the second PMOS transistor is connected to the source voltage, a source terminal of the second PMOS transistor is connected to the input/output pad, and a drain terminal and an n-well of the second PMOS transistor are connected to the drain terminal of the first PMOS transistor; and a second NMOS transistor, wherein a gate terminal of the second NMOS transistor is connected to the source voltage, a source terminal of the second NMOS transistor is connected to the input/output pad, and a drain terminal of the second NMOS transistor is connected to the gate terminal of the first PMOS transistor; and a gate control circuit coupled to a gate terminal of the PMOS transistor and the input/output pad for raising the gate terminal of the PMOS transistor to the input voltage level when the input voltage is greater than the source voltage.

5. The CMOS input/output control circuit of claim 4, wherein the gate control circuit includes:

a fourth PMOS transistor, wherein a n-well of the fourth PMOS transistor is connected to the drain terminal of the first PMOS transistor, and a source terminal of the fourth PMOS transistor is connected to an output terminal of a NAND gate;

a third NMOS transistor, wherein a drain terminal of the third NMOS transistor is connected to the source terminal of the fourth PMOS transistor, a source terminal of the third NMOS transistor is connected to a drain terminal of the fourth PMOS transistor as well as the gate terminal of the PMOS transistor, and a gate terminal of the third NMOS transistor is connected to the source voltage;

a fifth PMOS transistor, wherein a n-well of the fifth PMOS transistor is connected to the drain terminal of the first PMOS transistor, a gate terminal of the fifth PMOS transistor is connected to the source voltage, a drain terminal of the fifth PMOS transistor is connected to the drain terminal of the fourth PMOS transistor, and a source terminal of the fifth PMOS transistor is connected to the input/output pad;

a sixth PMOS transistor, wherein a gate terminal of the sixth PMOS transistor is connected to the source voltage, a n-well of the sixth PMOS transistor is connected to the drain terminal of the first PMOS transistor, a drain terminal of the sixth PMOS transistor is connected to a gate terminal of the fourth PMOS transistor, a source terminal of the sixth PMOS transistor is connected to the input/output pad; and a fourth NMOS transistor, wherein a gate terminal of the fourth NMOS transistor is connected to the source voltage, a drain terminal of the fourth NMOS transistor is connected to the gate terminal of the fourth PMOS transistor, and a source terminal of the fourth NMOS transistor is connected to the input/output pad.

6. A CMOS input/output control circuit capable of tolerating different input voltages, comprising:

an n-well control circuit coupled to an n-well of a PMOS transistor and an input/output pad for raising the n-well of the PMOS transistor to the input voltage level when the input voltage is greater than a source voltage, wherein the n-well control circuit comprises;

a first NMOS transistor, wherein a drain terminal and a gate terminal of the first NMOS transistor are connected to the source voltage;

a first PMOS transistor, wherein a source terminal of the first PMOS transistor is connected to the drain terminal of the first NMOS transistor, and a drain terminal and a gate terminal of the first PMOS transistor are connected to a source terminal of the first NMOS transistor as well as the n-well of the PMOS transistor;

a second PMOS transistor, wherein a gate terminal of the second PMOS transistor is connected to the source voltage, a source terminal of the second PMOS transistor is connected to the input/output pad, and a drain and an n-well of the second PMOS transistor are connected to the drain terminal of the first PMOS transistor; and a third PMOS transistor, wherein a gate terminal of the third PMOS transistor is connected to the source voltage, a drain terminal of the third PMOS transistor is connected to the gate terminal of the first PMOS transistor, an n-well of the third PMOS transistor is connected to the drain terminal of the first PMOS transistor, and a source terminal of the third PMOS transistor is connected to the input/output pad; and a gate control circuit coupled to a gate terminal of the PMOS transistor and the input/output pad for raising the gate terminal of the PMOS transistor to the input voltage level when the input voltage is greater than the source voltage.

7. The CMOS input/output control circuit of claim 6, wherein the gate control circuit includes:

a fourth PMOS transistor, wherein an n-well of the fourth PMOS transistor is connected to the drain terminal of the first PMOS transistor, a source terminal of the fourth PMOS transistor is connected to an output terminal of a NAND gate, and a gate terminal of the fourth PMOS transistor is connected to the gate terminal of the first PMOS transistor;

a second NMOS transistor, wherein a gate terminal of the second NMOS transistor is connected to the source voltage, a source terminal of the second NMOS transistor is connected to the input/output pad, and a drain terminal of the second NMOS transistor is connected to the gate terminal of the first PMOS transistor;

a third NMOS transistor, wherein a drain terminal of the third NMOS transistor is connected to the source terminal of the fourth PMOS transistor, a source terminal of the third NMOS transistor is connected to a drain terminal of the fourth PMOS transistor as well as the gate terminal of the PMOS transistor, and a gate terminal of the third NMOS transistor is connected to the source voltage; and a fifth PMOS transistor, wherein an n-well of the fifth PMOS transistor is connected to the drain terminal of the first PMOS transistor, a gate terminal of the fifth PMOS transistor is connected to the source voltage, a drain terminal of the fifth PMOS transistor is connected to the drain terminal of the fourth PMOS transistor, and a source terminal of the fifth PMOS transistor is connected to the input/output pad.

8. A CMOS input/output control circuit capable of tolerating different input voltages, comprising:

a NAND gate, wherein one input terminal of the NAND gate is an output enable signal terminal, and another input terminal of the NAND gate is an output signal terminal;

an inverter, wherein an input terminal of the inverter is connected to the output enable signal terminal;

a NOR gate, wherein one input terminal of the NOR gate is an output signal terminal, and another terminal of the NOR gate is connected to an output terminal of the inverter;

a PMOS transistor, wherein a source terminal of the PMOS transistor is connected to a source voltage, and a drain terminal of the PMOS transistor is connected to an input/output pad;

an NMOS transistor, wherein a source terminal of the NMOS transistor is connected to a low potential, a drain terminal of the NMOS transistor is connected to the input/output pad, and a gate terminal of the NMOS transistor is connected to the output terminal of the NOR gate;

a first NMOS transistor, wherein a drain terminal and a gate terminal of the first NMOS transistor are connected to the source voltage;

a first PMOS transistor, wherein a source terminal of the first PMOS transistor is connected to the drain terminal of the first NMOS transistor, and a drain terminal and a n-well of the first PMOS transistor are connected to a source terminal of the first NMOS transistor as well as a n-well of the PMOS transistor;

a second PMOS transistor, wherein a gate terminal of the second PMOS transistor is connected to the source voltage, a source terminal of the second PMOS transistor is connected to the input/output pad, and a drain terminal and a n-well of the second PMOS transistor are connected to the drain terminal of the first PMOS transistor;

a second NMOS transistor, wherein a gate terminal of the second NMOS transistor is connected to the source voltage, a source terminal of the second NMOS transistor is connected to the input/output pad, and a drain terminal of the second NMOS transistor is connected to a gate terminal of the first PMOS transistor;

a third PMOS transistor, wherein a gate terminal of the third PMOS transistor is connected to the source voltage, a drain terminal of the third PMOS transistor is connected to the gate terminal of the first PMOS transistor, a n-well of the third PMOS transistor is connected to the drain terminal of the first PMOS transistor, and a source terminal of the third PMOS transistor is connected to the input/output pad;

a fourth PMOS transistor, wherein a n-well of the fourth PMOS transistor is connected to the drain terminal of the first PMOS transistor and a source terminal of the fourth PMOS transistor is connected to the output signal terminal of the NAND gate;

a third NMOS transistor, wherein a drain terminal of the third NMOS transistor is connected to the source terminal of the fourth PMOS transistor, a source terminal of the third NMOS transistor is connected to a drain terminal of the fourth PMOS transistor as well as a gate terminal of the PMOS transistor, and a gate terminal of the third NMOS transistor is connected to the source voltage;

a fifth PMOS transistor, wherein a n-well of the fifth PMOS transistor is connected to the drain terminal of the first PMOS transistor, a gate terminal of the fifth PMOS transistor is connected to the source voltage, a drain terminal of the fifth PMOS transistor is connected to a drain terminal of the fourth PMOS transistor, and a source terminal of the fifth PMOS transistor is connected to the input/output pad;

a sixth PMOS transistor, wherein a gate terminal of the sixth PMOS transistor is connected to the source voltage, a n-well of the sixth PMOS transistor is connected to the drain terminal of the first PMOS transistor, a drain terminal of the sixth PMOS transistor is connected to a gate terminal of the fourth PMOS transistor, and a source terminal of the sixth PMOS transistor is connected to the input/output pad; and a fourth NMOS transistor, wherein a gate terminal of the fourth NMOS transistor is connected to the source voltage, a drain terminal of the fourth NMOS transistor is connected to the gate terminal of the fourth PMOS transistor, and a source terminal of the fourth NMOS transistor is connected to the input/output pad.

* * * * *